(12) United States Patent
Kodama

(10) Patent No.: US 11,177,395 B2
(45) Date of Patent: Nov. 16, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Eisuke Kodama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 10 days.

(21) Appl. No.: 16/813,442

(22) Filed: Mar. 9, 2020

(65) Prior Publication Data

US 2020/0294985 A1 Sep. 17, 2020

(30) Foreign Application Priority Data

Mar. 12, 2019 (JP) .............................. JP2019-044346

(51) Int. Cl.
| | | |
|---|---|---|
| *H01L 29/94* | (2006.01) | |
| *H01L 27/01* | (2006.01) | |
| *H01L 49/02* | (2006.01) | |
| *H01L 21/70* | (2006.01) | |
| *H01L 21/225* | (2006.01) | |
| *H01L 21/324* | (2006.01) | |

(Continued)

(52) U.S. Cl.
CPC .......... *H01L 29/94* (2013.01); *H01L 21/2253* (2013.01); *H01L 21/26513* (2013.01); *H01L 21/324* (2013.01); *H01L 21/705* (2013.01); *H01L 27/013* (2013.01); *H01L 27/0727* (2013.01); *H01L 27/0733* (2013.01); *H01L 28/60* (2013.01)

(58) Field of Classification Search
CPC ............... H01L 27/013; H01L 27/0288; H01L 27/0629; H01L 27/0647; H01L 27/0727; H01L 27/0733; H01L 28/40; H01L 28/56; H01L 28/60; H01L 21/705; H01L 21/2253; H01L 21/324; H01L 21/26513; H01L 23/642; H01L 29/92; H01L 29/94
See application file for complete search history.

(56) References Cited

U.S. PATENT DOCUMENTS

| | | | | |
|---|---|---|---|---|
| 4,001,869 A | * | 1/1977 | Brown ................ | H01L 27/0658 257/532 |
| 4,377,029 A | * | 3/1983 | Ozawa ................ | H01L 21/8222 257/532 |

(Continued)

FOREIGN PATENT DOCUMENTS

| | | |
|---|---|---|
| JP | 2000-340645 A | 12/2000 |
| JP | 2018-046136 A | 3/2018 |

*Primary Examiner* — Eduardo A Rodela
(74) *Attorney, Agent, or Firm* — McDermott Will & Emery LLP

(57) ABSTRACT

A semiconductor device includes a semiconductor substrate SUB, a semiconductor layer EP formed on the semiconductor substrate SUB, a buried layer PBL formed between the semiconductor layer EP and the semiconductor substrate SUB, an isolation layer PiSO formed in the semiconductor layer EP so as to be in contact with the buried layer PBL, and a conductive film FG formed over the isolation layer PiSO via an insulating film IF, whereby a first capacitive element including the conductive film FG as an upper electrode, the insulating film IF as a capacitive insulating film, and the isolation layer PiSO as a lower electrode, is formed over the semiconductor substrate SUB.

9 Claims, 18 Drawing Sheets

(51) Int. Cl.
  *H01L 21/265* (2006.01)
  *H01L 27/07* (2006.01)

(56) References Cited

U.S. PATENT DOCUMENTS

| | | | | |
|---|---|---|---|---|
| 5,360,989 | A * | 11/1994 | Endo | H01L 29/94 257/532 |
| 6,392,285 | B1 * | 5/2002 | Huang | H01L 27/0635 257/577 |
| 6,573,588 | B1 * | 6/2003 | Kumamoto | H01L 29/92 257/371 |
| 2003/0094708 | A1 * | 5/2003 | Itou | H01L 29/94 257/347 |
| 2004/0084712 | A1 * | 5/2004 | Lin | H01L 28/40 257/314 |
| 2008/0283965 | A1 * | 11/2008 | Nakamura | H01L 27/0921 257/532 |
| 2015/0194538 | A1 * | 7/2015 | Marino | H01L 29/93 327/530 |
| 2018/0076191 | A1 | 3/2018 | Kodama | |
| 2019/0363188 | A1 * | 11/2019 | You | H01L 21/26513 |
| 2020/0135863 | A1 * | 4/2020 | Han | H01L 27/1203 |
| 2020/0294985 | A1 * | 9/2020 | Kodama | H01L 21/705 |

\* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2019-044346 filed on Mar. 12, 2019 including the specification, drawings and abstract is incorporated herein by reference in its entirety.

BACKGROUND OF THE INVENTION

The present invention relates to a semiconductor device and a manufacturing method thereof, and in particular, the present invention can be suitably applied to a semiconductor device having a device isolation region formed of an impurity region.

In recent years, a semiconductor device (semiconductor chip) for use in a vehicle is required to have a performance that operates normally even when subjected to electromagnetic interference such as EMC (Electro Magnetic Compatibility) resistance. As a method for improving the resistance to EMCs, by providing a capacitance between the power supply potential (Vdd) and the reference potential (Vss, GND), it is possible to attenuate noises (electromagnetic interference) that have entered the power supply wiring. Therefore, it is required to increase the number of capacitor elements formed in the semiconductor device and to increase the capacitance as much as possible.

On the other hand, as methods of electrically isolating a plurality of semiconductor elements including a capacitor element, a transistor, and the like provided in a semiconductor substrate, there are a technique of providing an insulating isolation portion made of a silicon oxide film in the vicinity of a surface of a semiconductor substrate, and a technique of forming element isolation regions by a p-n junction.

For example, Patent Document 1 discloses a technique in which a groove is formed in an insulating isolation portion provided in the vicinity of the front surface of a semiconductor substrate, a lower electrode of a capacitor is formed in the groove, and a capacitor insulating film and an upper electrode are formed on the lower electrode.

Patent Document 2 discloses a technique in which an n-type epitaxial layer is provided on a p-type semiconductor substrate and a plurality of semiconductor elements are formed in the epitaxial layer. A technique of forming element isolation regions for electrically isolating a plurality of semiconductor elements by providing p-type impurity regions over the semiconductor substrate from the surfaces of the epitaxial layers has been disclosed.

[Patent Document 1] Japanese Unexamined Patent Application Publication No. 2000-340645

[Patent Document 2] Japanese Unexamined Patent Application Publication No. 2018-046136

SUMMARY OF THE INVENTION

In order to manufacture a large-capacity semiconductor device and improve the performance of the semiconductor device, it is only necessary to increase the number of capacitive elements formed in the semiconductor substrate, but this increases the chip size of the semiconductor device and hinders the miniaturization of the semiconductor device. As another method, although the value of the unit capacitance can be increased by reducing the thickness of the capacitor insulating film of each of the existing capacitor elements, there is a possibility that the reliability of the capacitor elements is not maintained because the withstand voltage is thereby lowered.

Therefore, it is conceivable that a capacitor element is formed in an insulating isolation portion where a semiconductor element is not normally formed, as in Patent Document 1, thereby miniaturizing the semiconductor device and increasing the capacitance of the entire semiconductor device. However, in order to manufacture the capacitive element as disclosed in Patent Document 1, not only an existing manufacturing process but also an additional manufacturing process is required, and therefore, there is a problem that manufacturing cost increases.

Other objects and novel features will become apparent from the description of this specification and the accompanying drawings.

Means of Solving the Problems

The typical ones of the embodiments disclosed in the present application will be briefly described as follows.

The semiconductor device according to one embodiment includes a second region in which a first semiconductor element is formed, a third region in which a second semiconductor element is formed, and a first region for electrically insulating the second region and the third region. The semiconductor device also has a semiconductor substrate of a first conductivity type, a semiconductor layer formed on the semiconductor substrate and of a second conductivity type opposite to the first conductivity type, a first buried layer of the first conductivity type formed in the semiconductor substrate in the first region, and an isolation layer of the first conductivity type formed from a front surface of the semiconductor layer to an inside of the semiconductor layer so as to be in contact with the first buried layer in the first region. Here, a first upper electrode is formed on the separation layer with a first capacitive insulating film interposed therebetween, and in the first region, a first capacitive element including the first upper electrode, the first capacitive insulating film, and the separation layer as a first lower electrode, is formed.

According to one embodiment, the performance of the semiconductor device can be improved.

DETAILED DESCRIPTION OF THE EMBODIMENTS

Figure 1:
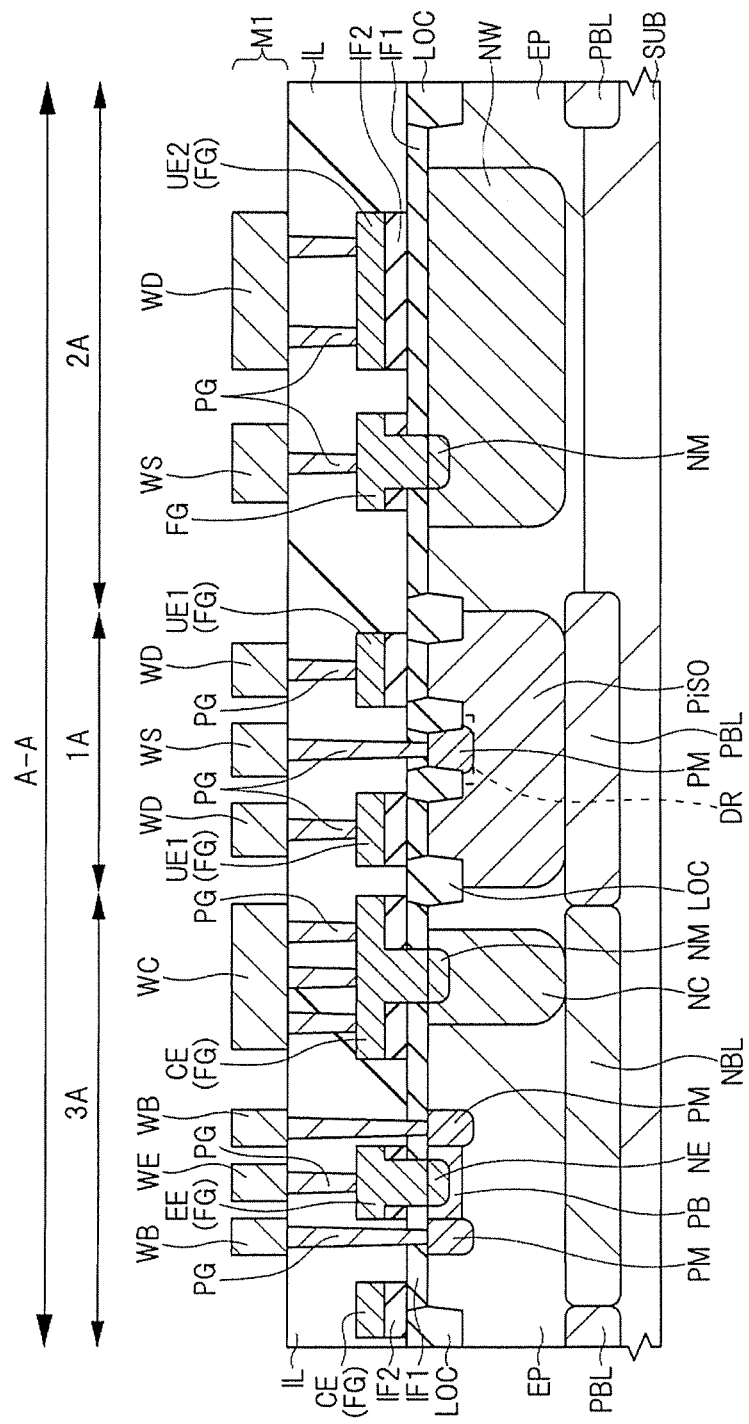
FIG. 1 is a cross-sectional view of a semiconductor device according to Embodiment 1.

In the following embodiments, when required for convenience, the description will be made by dividing into a plurality of sections or embodiments. But except when specifically stated, they are not independent of each other, and one is a part of the other, or all of the other modifications, or is related to details or supplementary description. In the following embodiments, the number of elements, including the number of elements, numerical values, quantities, ranges etc., is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted even in the case of cross-sectional view or hatching may be added even in the case of plan view in order to make the drawings easier to see.

Embodiment 1

The semiconductor device of the present embodiment will be described below by referring to the drawings. The semiconductor device of the present embodiment has a capacitor element using an isolation-layer PiSO which is a p-type impurity region in an element isolation region 1A in which no semiconductor element such as a capacitor element or a transistor is conventionally formed.

<Structure of the Semiconductor Device>

Figure 2:
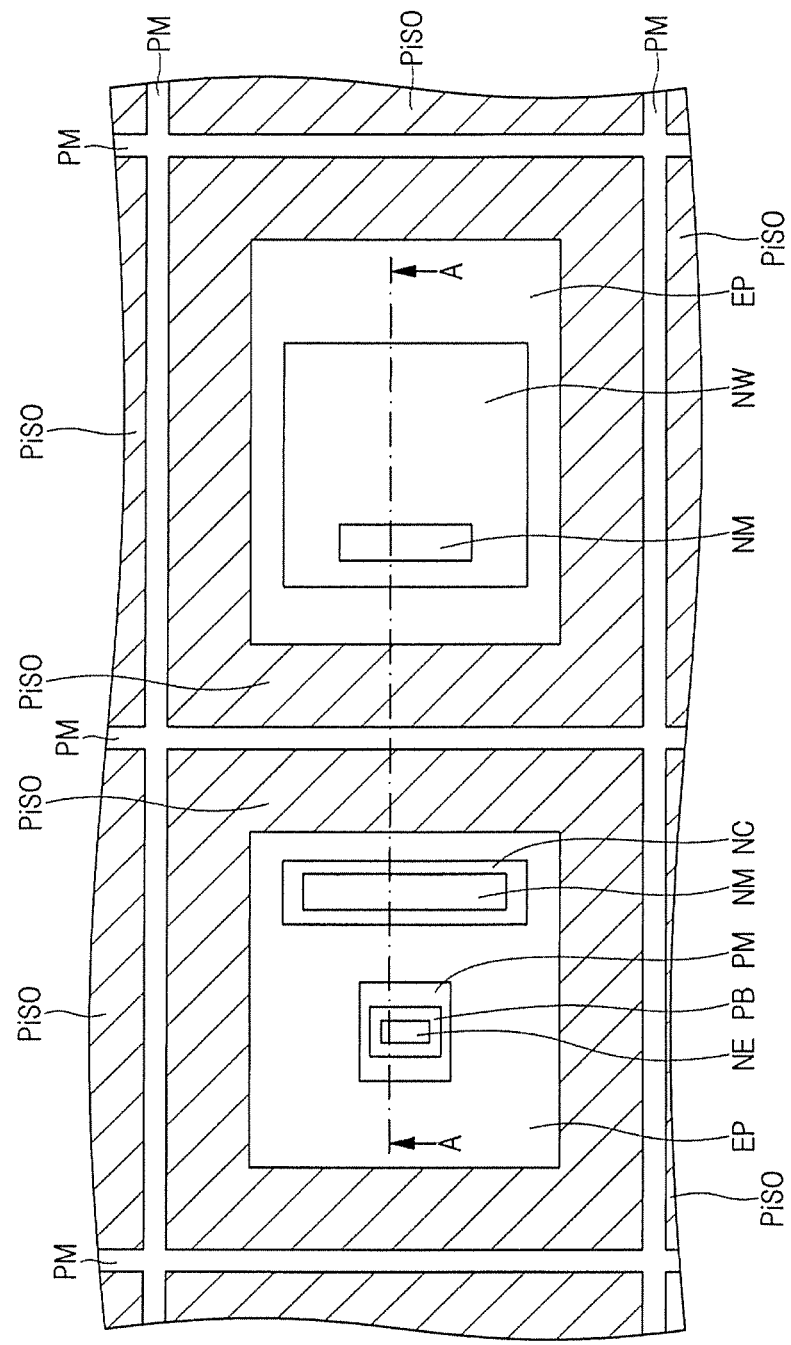
FIG. 2 is a plan view of the semiconductor device according to Embodiment 1.
Figure 3:
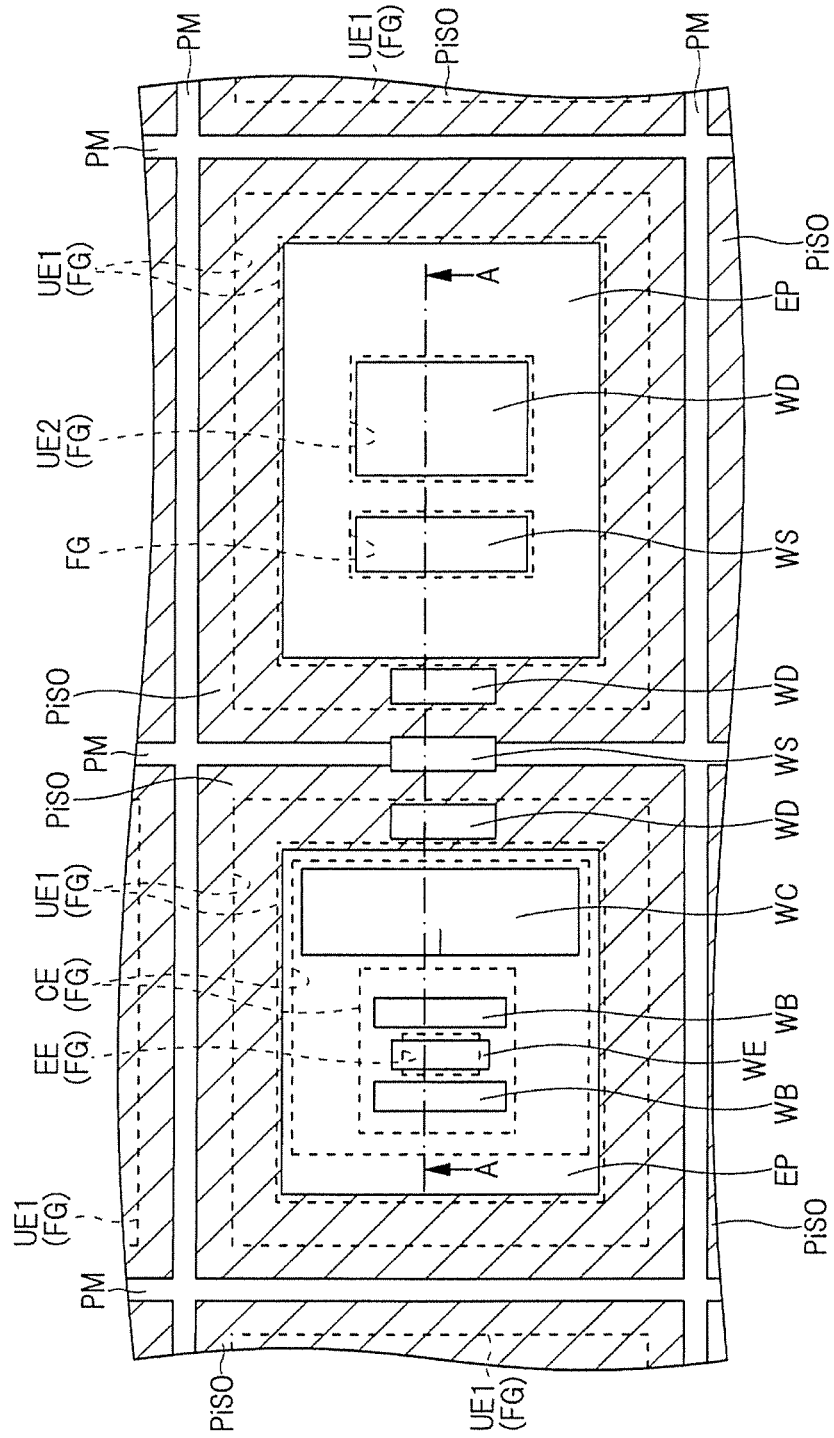
FIG. 3 is a plan view of the semiconductor device according to Embodiment 1.

Hereinafter, the structure of the semiconductor device of the present embodiment will be described in detail with reference to FIGS. 1 to 3. FIG. 1 shows a cross-sectional view of the semiconductor device and is a cross-sectional view along the line A-A shown in FIGS. 2 and 3. FIG. 2 shows the planar structures of the semiconductor device, and shows the relative positions of the impurity regions formed in the vicinity of the surfaces of the n-type semiconductor layers shown in FIG. 1. FIG. 3 shows the planar structures of the semiconductor device, and shows the relative positions of the electrodes made of the conductive film FG shown in FIG. 1 and the relative positions of the wiring formed on the first wiring layer M1. In FIG. 3, each electrode formed of the conductive film FG is indicated by a broken line. Although FIG. 2 and FIG. 3 are plan view, the isolation layers PiSO are hatched for the sake of clarity.

FIG. 1 shows a region (capacitor element forming region) 2A in which a capacitor element which is a semiconductor element is formed, a region (bipolar transistor forming region) 3A in which an NPN bipolar transistor which is a semiconductor element is formed, and a region (element isolation region) 1A for electrically isolating the semiconductor elements. The semiconductor device of the present embodiment comprises these regions 1A~3A and, although not described here, also includes other semiconducting elements formed in regions other than the region 1A~3A, such as MOS transistors, resistor elements, etc.

As shown in FIG. 1, a semiconductor layer EP into which an n-type impurity is introduced is formed on a p-type semiconductor substrate SUB. The materials constituting the semiconductor substrate SUB and the semiconductor layer EP are, for example, silicon, and the semiconductor layer EP is an impurity region formed by an epitaxial growth method and has a thickness of, for example, 10 micrometers.

A plurality of insulating isolation portions LOC are formed on the surface of the semiconductor layer EP. Each of the plurality of insulating isolation portions LOCs includes a silicon oxide film formed by selectively thermally oxidizing a portion of the semiconductor layer EP to form a LOCOS (Local Oxidation of Silicon) structure. The thickness of the insulating isolation portion LOC is, for example, 150 to 300 nm. The isolation portions LOCs may have STI (Shallow Trench Isolation) structures. The STI structure is a structure in which an insulating film such as a silicon oxide film is buried in a groove formed in the semiconductor layer EP.

<Structure of the Region 1A as the Element Separation Region>

In the region 1A, the semiconductor substrate SUB, so as to straddle the boundary between the semiconductor substrate SUB and the semiconductor layer EP, p-type embedded layer PBL is formed. The buried layers PBLs are impurity regions having impurity concentrations higher than those of the semiconductor substrate SUB.

A p-type isolation layer PiSO is formed from the front surface of the semiconductor layer EP to the inside of the semiconductor layer EP so as to be in contact with the buried layer PBL. The isolation layer PiSO is an impurity region having an impurity concentration higher than the impurity concentration of the buried layer PBL. In the isolation layer PiSO, p-type diffused regions PMs are formed as part of the isolation layer PiSO. The diffusion region PM is an impurity region having an impurity concentration higher than the impurity concentration of the isolation layer PiSO, and the diffusion region PM is mainly provided in order to lower the contact resistance between the plug PG and the isolation layer PiSO, which will be described later. As shown in FIGS. 2 and 3, the isolation layer PiSO including the diffused region PM surrounds each of the region 2A and the region 3A in plan view.

The isolation layer PiSO has a defective region DR indicated by a broken line in FIG. 1. The defect region DR is a region in which ion implantation for forming the separation layer PiSO has been performed, and the defect region DR is a region having a defect density high than the defect density of the surrounding separation layer PiSO, such as the separation layer PiSO immediately below the conductive film FG (upper electrode UE1), for example. The diffusion region PM is formed in a part of the defect region DR.

An insulating film IF1 such as a silicon oxide film is formed on the semiconductor layer EP. The insulating film IF1 is provided between the plurality of insulating isolation portions LOCs and has a thickness of, for example, 50 nm to 80 nm.

An insulating film IF2 such as, for example, a silicon nitride film is formed on the upper surface of each of the insulating film IF1 and a part of the insulating isolation portion LOCs. The thickness of the insulating film IF2 is, for example, 100 nm to 300 nm. On the insulating film IF2, a conductive film FG made of, for example, a polysilicon film into which an n-type impurity is introduced is formed. The thickness of the conductive film FG is, for example, 100 nm to 300 nm.

An interlayer insulating film IL such as a silicon oxide film is formed on the conductive film FG. A plurality of contact holes are formed in the interlayer insulating film IL, and a plug PG mainly composed of a tungsten film is buried in each of the plurality of contact holes. The plug PG specifically includes, for example, a barrier metal film and the tungsten film, and the barrier metal film is, for example, a laminated film of a titanium film and a titanium nitride film. In the region 1A, some of the plugs PG are connected to the conductive film FG, and some of the plugs PG are connected to the diffused region PM.

A first wiring layer M1 is provided on the interlayer insulating film IL, and a plurality of wiring are formed on the first wiring layer M1. Each of the plurality of wiring includes an aluminum film as a main component, and specifically includes, for example, a first barrier metal film, the aluminum film formed on the first barrier metal film, and a second barrier metal film formed on the aluminum film. The first barrier metal film and the second barrier metal film are, for example, laminated films of a titanium film and a titanium nitride film.

In the region 1A, the first wiring layer M1 is provided with a power supply potential wiring WD for supplying a power supply potential (Vdd) and a reference potential wiring WS for supplying a reference potential (Vss, GND). The power supply potential wiring WD is electrically connected to the conductive film FG via the plug PG, and the reference potential wiring WS is electrically connected to the isolation layers PiSO via the plug PG and the diffused regions PM. Therefore, the reference potentials Vss and GND are applied to the semiconductor substrate SUBs together with the isolation layer PiSO and the buried layer PBL. Therefore, the semiconductor elements formed in the semiconductor layer EP other than the region 1A, such as the region 2A and the region 3A, can be electrically isolated by the isolation layer PiSO.

In addition, since the power supply potential (Vdd) is supplied to the conductive film FG and the reference potential (Vss, GND) is supplied to the isolation layer PiSO, in the region 1A, a capacitor is formed in which the conductive film FG is the upper electrode UE1, the insulating film IF2 and the insulating film IF1 are the capacitor insulating film, and the isolation layer PiSO is the lower electrode. It should be noted that what is used as a capacitance value is a region directly below the upper electrodes UE1, and not only the insulating film IF2 and the insulating film IF1 but also a part of the insulating isolation portion LOC are used as a part of the capacitance insulating film. However, the capacitance value obtained through a part of the insulating isolation portion LOC is very small because the thickness of the capacitor insulating film increases. When the insulating isolation structure LOC has a LOCOS configuration, a bird's peak occurs at the end portion of the insulating isolation portion LOC, but in present embodiment, such a bird's peak is also defined as a part of the insulating isolation portion LOC.

The main feature of the present embodiment is to provide an additional capacitive element using a separate-layer PiSO in the region 1A in addition to the capacitive element of the region 2A described below, and the detail of such a feature will be described later.

<Structure of the Region 2A as a Capacitor Forming Region>

In the region 2A, the semiconductor layer EP, n-type well region NW is formed. The well region NW is an impurity region having an impurity concentration higher than that of the semiconductor layer EP. An n-type diffusion region NM is formed in a part of the well region NW. The diffusion region NM is an impurity region having an impurity concentration higher than that of the well region NW, and is mainly provided to lower contact resistance between the conductive film FG and the well region NW, which will be described later.

An insulating film IF1, an insulating film IF2, and a conductive film FG are formed on the well region NW similarly to the region 1A. In a part of the region 2A, an opening is provided in the insulating film IF1 and the insulating film IF2, and the conductive film FG is buried in the opening so as to be in contact with the diffused region NM. The conductive film FG in the region 2A constitutes a connecting portion between the reference potential wiring WS and the diffused region NM.

An interlayer insulating film IL is formed on the conductive film FG, and a plug PG connected to the conductive film FG is formed on the interlayer insulating film IL.

A first wiring layer M1 is provided on the interlayer insulating film IL, and a power supply potential wiring WD and a reference potential wiring WS are provided on the first wiring layer M1 in the area 2A. The power supply potential wiring WD is electrically connected to the conductive film FG formed on the insulating film IF2 via the plug PG, and the reference potential wiring WS is electrically connected to the conductive film FG in direct contact with the diffused area NM via the plug PG. Therefore, the reference potentials Vss and GND are supplied to the well region NW.

In this manner, in the region 2A, a capacitor is formed in which the conductive film FG connected to the power supply potential wiring WD is the upper electrode UE2, the insulating film IF2 and the insulating film IF1 are the capacitive insulating film, and the well region NW is the lower electrode.

<Structure of the Region 3A as a Bipolar Transistor Forming Region>

In the region 3A, the semiconductor substrate SUB, so as to straddle the boundary between the semiconductor substrate SUB and the semiconductor layer EP, n-type embedded layer NBL is formed. The buried layer NBL is an impurity region having an impurity concentration higher than that of the semiconductor layer EP.

An n-type collector region NC is formed in the semiconductor layer EP above the buried layer NBL so as to be in contact with the buried layer NBL. The collector region NC is an impurity region having an impurity concentration higher than that of the buried layer NBL. An n-type diffusion region NM is formed in a part of the collector region NC. The diffusion region NM is an impurity region having an impurity concentration higher than that of the collector region NC, and is mainly provided in order to lower a contact resistance between a conductive film FG (collector electrode CE) to be described later and the collector region NC.

Two p-type diffusion regions PM, a p-type base region PB, and an n-type emitter region NE are formed in the semiconductor layer EP at a position separated from the collector region NC. The base region PB is formed at a position sandwiched between two diffusion regions PM in a cross-sectional view, and is an impurity region having an impurity concentration lower than that of the diffusion region PM. The emitter region NE is formed in the base region PB and has an impurity concentration higher than that of the semiconductor layer EP.

In this manner, in the region 3A, an NPN-bipolar transistor is formed in which the collector region NC and the semiconductor layer EP are used as collectors, the base region PB is used as a base, and the emitter region NE is used as an emitter.

An insulating film IF1, an insulating film IF2, and a conductive film FG are formed on the semiconductor layer EP including the NPN bipolar transistor, similarly to the region 1A or the region 2A. Immediately above the emitter region NE, an opening is formed in the insulating film IF1 and the insulating film IF2, and a conductive film FG (emitter electrode EE) is buried in the opening so as to be in contact with the emitter region NE. Further, an opening is provided in the insulating film IF1 and the insulating film IF2 just above the diffusion region NM in the collector region NC, and the conductive film FG (collector electrode CE) is buried in the opening so as to be in contact with the diffusion region NM.

As shown in FIG. 3, the collector electrode CE is disposed so as to surround the outer periphery of the region 3A in plan view, and the collector electrode CE is formed on the semiconductor layer EP with the insulating film IF1 and the insulating film IF2 interposed therebetween. Therefore, the collector electrode CE also functions as a reversal prevention plate for preventing the surface of the semiconductor layer EP from being reversed.

An interlayer insulating film IL is formed on the emitter electrode EE and the collector electrode CE, and a plug PG connected to the base region PB, the emitter electrode EE and the collector electrode CE, respectively, is formed on the interlayer insulating film IL.

A first wiring layer M1 is provided on the interlayer insulating film IL, and in the region 3A, the first wiring layer M1 is provided with a collector wiring WC electrically connected to the collector electrode CE via the plug PG, an emitter wiring WE electrically connected to the emitter electrode EE via the plug PG, and a base wiring WB electrically connected to the diffused region PM via the plug PG. Therefore, the collector region NC is electrically connected to the collector wiring WC, the emitter region NE is electrically connected to the emitter wiring WE, and the base region PB is electrically connected to the base wiring WB via the plugs PG and the diffused region PM.

Comparative Example

Figure 4:
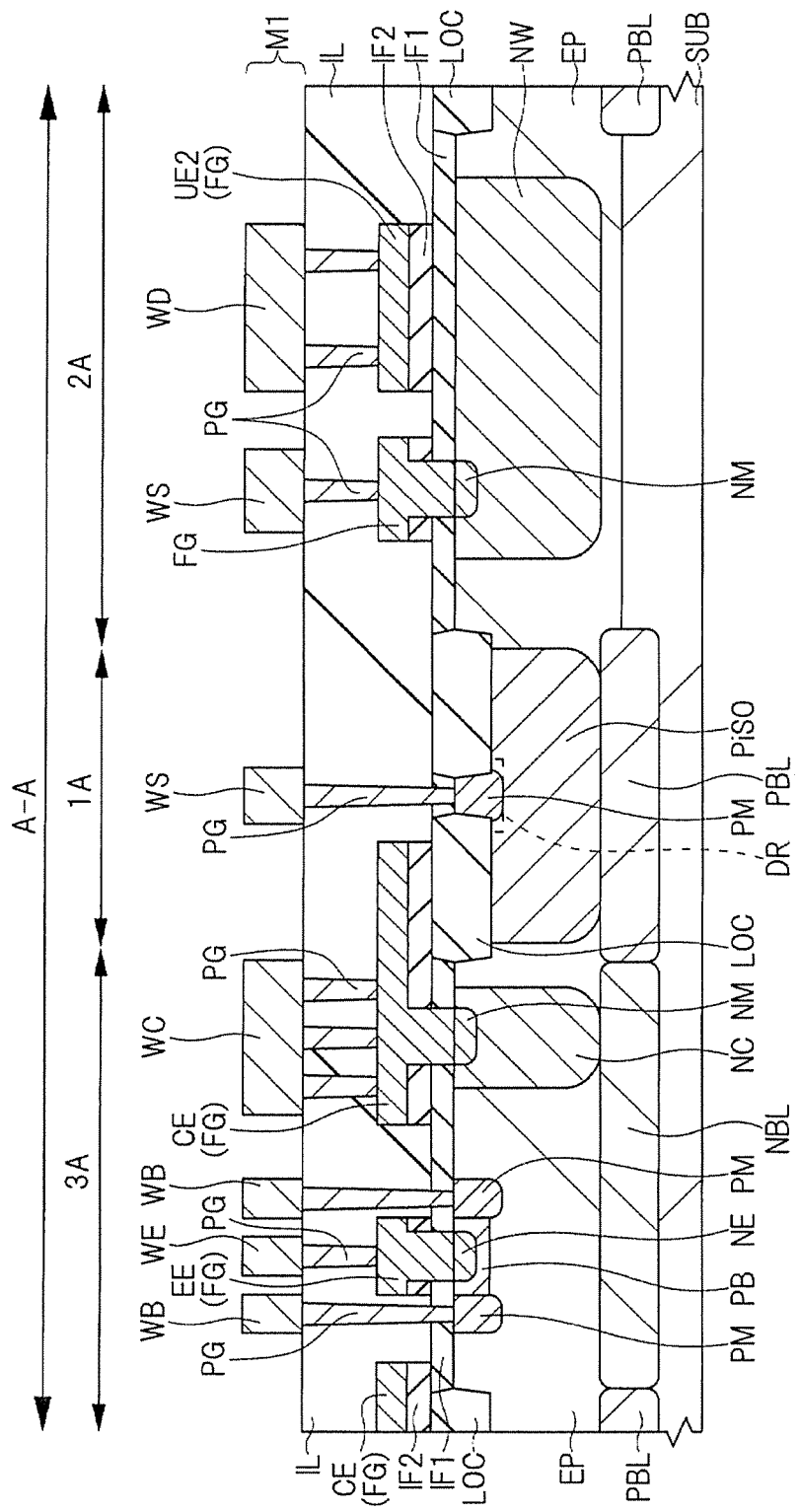
FIG. 4 is a cross-sectional view of a semiconductor device according to a comparative example.

Hereinafter, the structures of the semiconductor device of the comparative example will be described with reference to FIG. 4. FIG. 4 is a cross-sectional view of a portion of the present embodiment corresponding to FIG. 1.

In the comparative examples, similarly to the present embodiment, a capacitor element is formed in the region 2A, an NPN-bipolar transistor is formed in the region 3A, and a region 1A which is an element isolation region is provided between the region 2A and the region 3A. In the region 1A of the comparative embodiment, the isolation layer PiSO is electrically connected to the reference potential wiring WS via the diffused region PM and the plugs PG, and the reference potentials Vss and GND are applied to the semiconductor substrate SUBs together with the isolation layer PiSO and the buried layer PBL. Accordingly, the regions 2A and 3A are electrically isolated by the isolation layers PiSO.

However, in the comparative examples, unlike the present embodiment, the capacitor elements using the isolation layers PiSO are not formed in the regions 1A. For this reason, for example, when it is desired to manufacture a semiconductor device for vehicle use and increase the capacitance in order to improve the resistance to EMCs, it is required to increase the region in which the capacitive elements such as the area 2A are formed, resulting in a large increase in the size of the chips. In addition, if the value of the unit capacitance is increased by reducing the thickness of the capacitor insulating film, the reliability of the capacitor may not be maintained.

<Main Features of the Semiconductor Device>

The following describes the main features of the semiconductor device of the present embodiment.

As described above, in the present embodiment, in the region 1A which is the element isolation region, the capacitor element is formed in which the conductive film FG is the upper electrode UE1, the insulating film IF2 and the insulating film IF1 are the capacitor insulating film, and the isolation layer PiSO is the lower electrode. Therefore, the capacitance can be increased without various problems as described in the comparative example.

Figure 5:
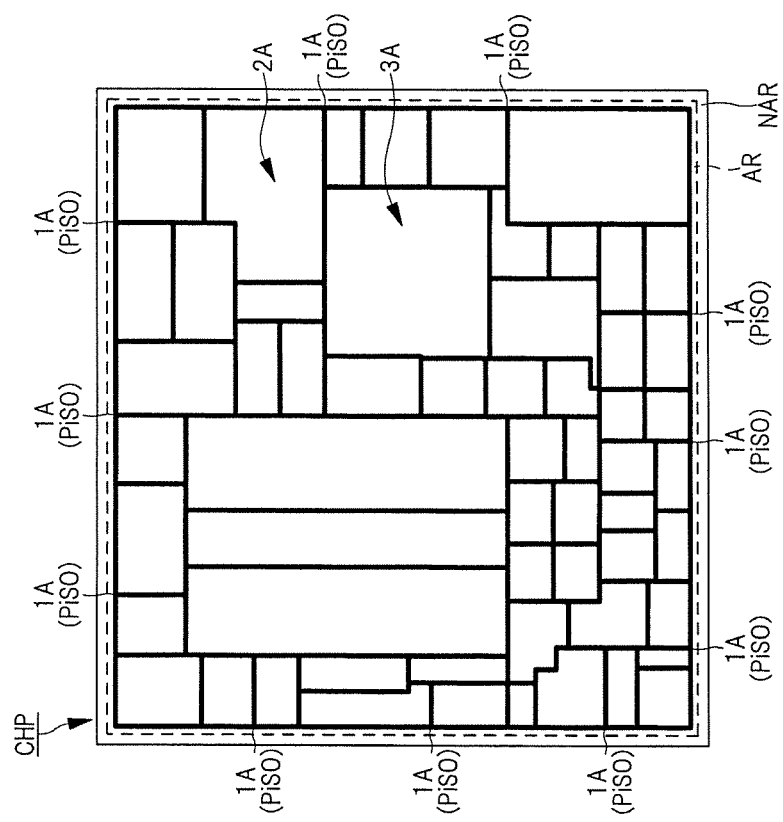
FIG. 5 is a plan view of an entire layout of a semiconductor chip of the semiconductor device according to Embodiment 1.

FIG. 5 is a plan view showing the entire layout of the semiconductor chip CHP, which is a semiconductor device of the present embodiment. In FIG. 5, a region indicated by a broken line is a product region (active region) AR including a region 1A to 3A, surrounds a scribe region (inactive region) NAR, and a region located between the product region AR and an end portion of the semiconductor chip CHP is a scribe region (inactive region) NAR. The regions 1A in which the isolation layers PiSO are formed are indicated by thick solid lines. The region 1A is used for electrically isolating various semiconductor elements formed not only between the region 2A and the region 3A but also in other regions.

As described above, by providing the capacitor element having the region 1A described with reference to FIGS. 1 to 3 over the entire semiconductor chip CHP as shown in FIG. 5, the capacitance can be efficiently increased without increasing the area of the region 2A which is the capacitor element forming region.

For example, when the capacitance value obtained in the semiconductor device of the comparative example (the capacitance value of the region 2A) is about 3 pF, the capacitance value obtained in the semiconductor device of the present embodiment (the capacitance value of the sum of the region 1A and the region 2A) is 10 pF or more.

Since the reference potentials Vss and GND are supplied to the isolation layer PiSO, the buried layer PBL, and the semiconductor substrate SUB, the isolation layer PiSO of the present embodiment also functions as an isolation layer for electrically isolating the region 2A and the region 3A.

That is, in the semiconductor device of the present embodiment, the capacitance can be increased while the isolation layer PiSO is provided with a function as an isolation layer. Therefore, the performance of the semiconductor device can be improved without hindering the miniaturization of the semiconductor device.

Figure 6:
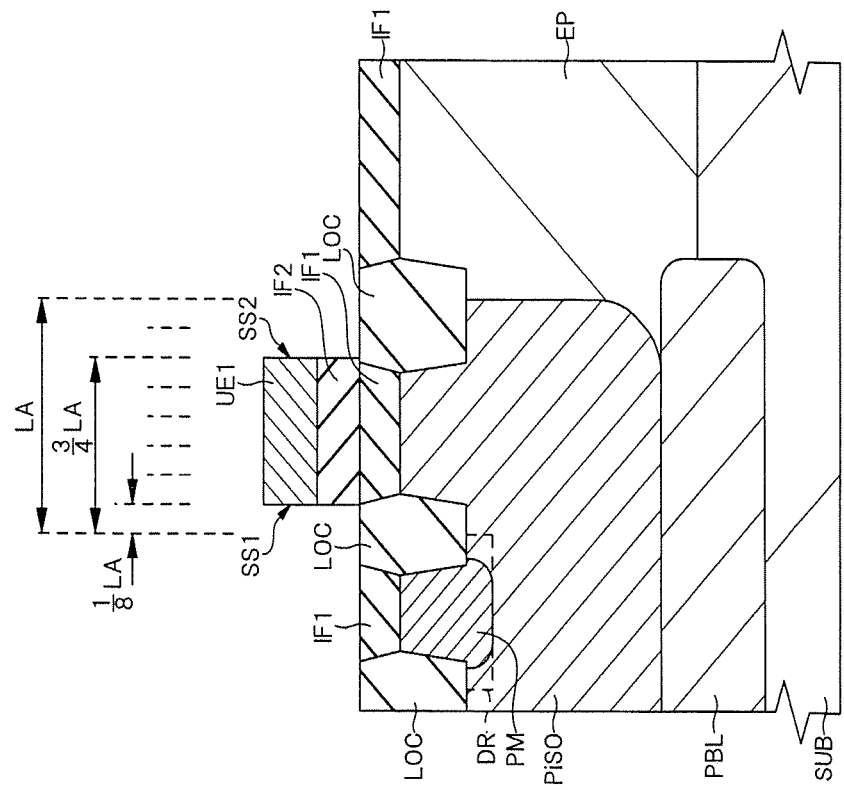
FIG. 6 is an enlarged cross-sectional view of the semiconductor device according to Embodiment 1.

FIG. 6 is an enlarged cross-sectional view showing a portion of the region 1A where the capacitor elements are formed, and is related to the manufacturing process of FIG. 11 and the like, which will be described later. The distance LA shown in FIG. 6 represents the distance from the end portion of the separation layer PiSO immediately after the ion implantation, that is, the end portion of the separation layer PiSO before the heat treatment to the end portion of the separation layer PiSO after the heat treatment. In other words, the distance LA is the distance from the defective area DR to the interface between the isolation layer PiSO and the semiconducting layer EP. The end portion of the isolation layer PiSO and the distance LA in the present embodiment are an end portion and a distance in the horizontal direction (for example, in the direction perpendicular to the thickness direction of the semiconductor layer EP) respectively.

The upper electrodes UE1 have a side surface SS1 and a side surface SS2 opposite to the side surface SS1. The side surface SS1 is located closer to the diffused region PM and the defective region DR than the side surface SS2, and is further away from the interface between the isolation layer PiSO and the semiconducting layer EP than the side surface SS2. In other words, the side surface SS2 is located farther from the diffused region PM and the defective region DR than the side surface SS1, and is located closer to the interface between the isolation layer PiSO and the semiconducting layer EP than the side surface SS1.

In the present embodiment, the side surface SS1 of the upper electrode UE1 is located away from the defect region DR having a high defect density, and is located so as not to overlap the defect region DR in plan view. That is, the side surfaces SS1 of the upper electrodes UE1 are not positioned directly above the diffusion regions PM, but are positioned so as not to overlap the diffusion regions PM in plan view. More preferably, the side surface SS1 of the upper electrodes UE1 is provided at a position (⅛)×distance LA or more from the defect region DR, and is provided at a position (⅛)× distance LA from the defect region DR in FIG. 6.

This is because the surfaces of the defect regions DR in which ion implantation for forming the isolation layers PiSO has been performed are damaged, and high-density defects exist in the defect regions DR, and therefore, if a capacitive insulating film such as an insulating film IF1 is provided at such locations, the film quality of the capacitive insulating film may be deteriorated. Therefore, in the present embodiment, the upper electrodes UE1 are not provided directly above the defective regions DRs. The side surface SS1 of the upper electrodes UE1 is set at a position equal to or larger than (⅛)×(LA) from the defective regions DR in view of the masking deviation at the time of ion implantation. As a result, the film quality of the capacitor insulating film can be maintained satisfactorily.

The side surfaces SS2 of the upper electrodes UE1 are not located directly above the semiconductor layer EP, but are provided inside the separation layer PiSO from the border between the separation layer PiSO and the semiconductor layer EP. More preferably, the side surface SS2 of the upper electrode UE1 is provided at a position equal to or less than (¾)×the distance LA from the defect region DR, and is provided at a position equal to or less than (¾)×the distance LA from the defect region DR in FIG. 6. The reason for this will be described below with reference to FIG. 7.

Figure 7:
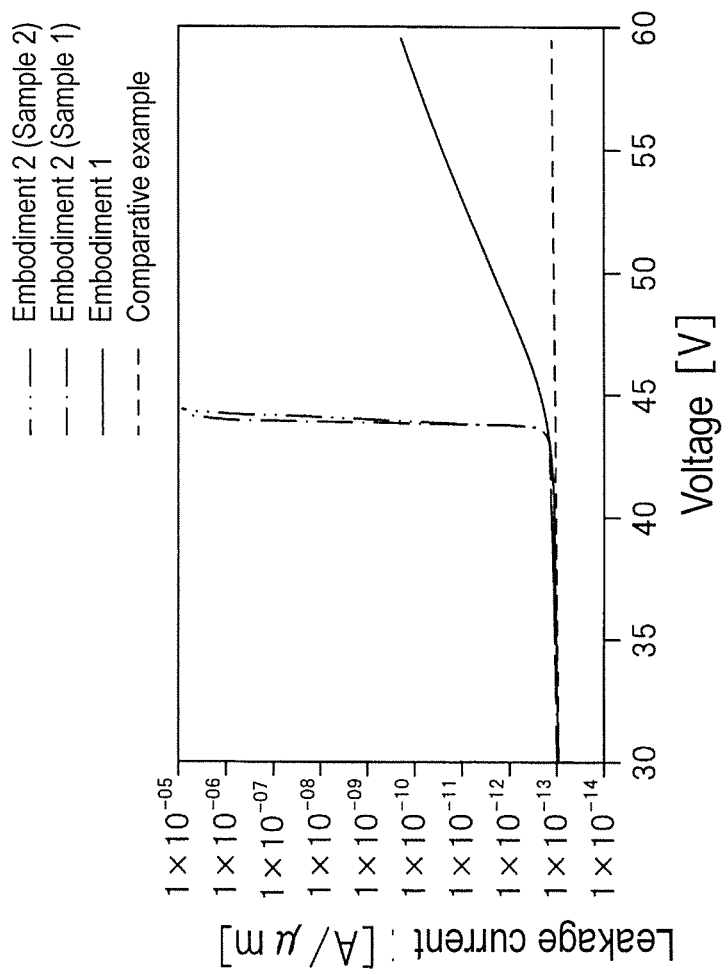
FIG. 7 is a graph showing the results of a simulation performed by the present inventor.

FIG. 7 is a graph showing the results of simulations performed by the inventors of the present application regarding the relationship between the leakage current and the breakdown voltage in the vicinity of the interface between the isolation layer PiSO and the semiconductor layer EP. The vertical axis of FIG. 7 shows the leakage current occurring at the interface between the isolation layer PiSO and the semiconductor layer EP, and the horizontal axis of FIG. 7 shows the voltages applied to the upper electrodes UE1 and the semiconductor layer EP. Here, among the four graphs shown in FIG. 7, the graphs of the embodiment 1 and the comparative examples will be described, but the graphs of the embodiment 2 and the embodiment 3 will be described later.

In the present embodiment, the insulating isolation portions LOCs are not formed in the vicinity of the boundaries between the isolation layers PiSO and the semiconducting layers EP, and the capacitive elements are formed in the regions where the insulating isolation portions LOCs are omitted. Therefore, since the upper electrode UE1 is formed in the omitted region, the electric field concentration is apt to occur at the interface between the separation layer PiSO and the semiconductor layer EP by the voltage applied to the upper electrode UE1 and the semiconductor layer EP, and the breakdown voltage between the separation layer PiSO and the semiconductor layer EP is apt to decrease.

For example, in the graph of the comparative example shown in FIG. 7, since a capacitor such as a present embodiment does not exist, even if the voltage applied to the semiconductor layer EP is changed, the leakage current is increased to a very small amount.

On the other hand, in the graphs of the embodiment 1, the leakage current is gradually increased from a voltage exceeding 43V applied to the upper electrodes UE1 and the semiconductor layers EP. Therefore, from the viewpoint of reliability of the semiconductor device in the high-voltage range, the semiconductor device of the comparative examples is excellent.

However, as described above, in the semiconductor device of the present embodiment, the capacitance can be increased by efficiently utilizing the region 1A. In particular, in the case of 43V or less, the capacitance can be increased in a state in which the increase of the leakage current is substantially the same as that of the comparative example. Depending on the product specification, the value of the leakage current at a point exceeding 43V may be within an allowable range. Further, as shown in FIG. 7, since the increase of the leakage current is not rapid, breakdown due to a decrease in breakdown voltage does not occur. Therefore, even in the high-voltage range exceeding 43V, the semiconductor device of the present embodiment can be used in some cases.

The reason why the result of FIG. 7 is obtained in the semiconductor device of the present embodiment is that the side surface SS2 of the upper electrode UE1 is provided at a position closer to the inside of the isolation layer PiSO than the interface between the isolation layer PiSO and the semiconductor layer EP, and is provided at a position equal to or less than (¾)×the distance LA from the defective area DR. This makes it possible to maintain a balance between the increase of the capacitance value and the suppression of the leakage current.

<Manufacturing Method of the Semiconductor Device>

The manufacturing method of the semiconductor device of the present embodiment will be described below with reference to FIGS. 8 to 16.

Figure 8:
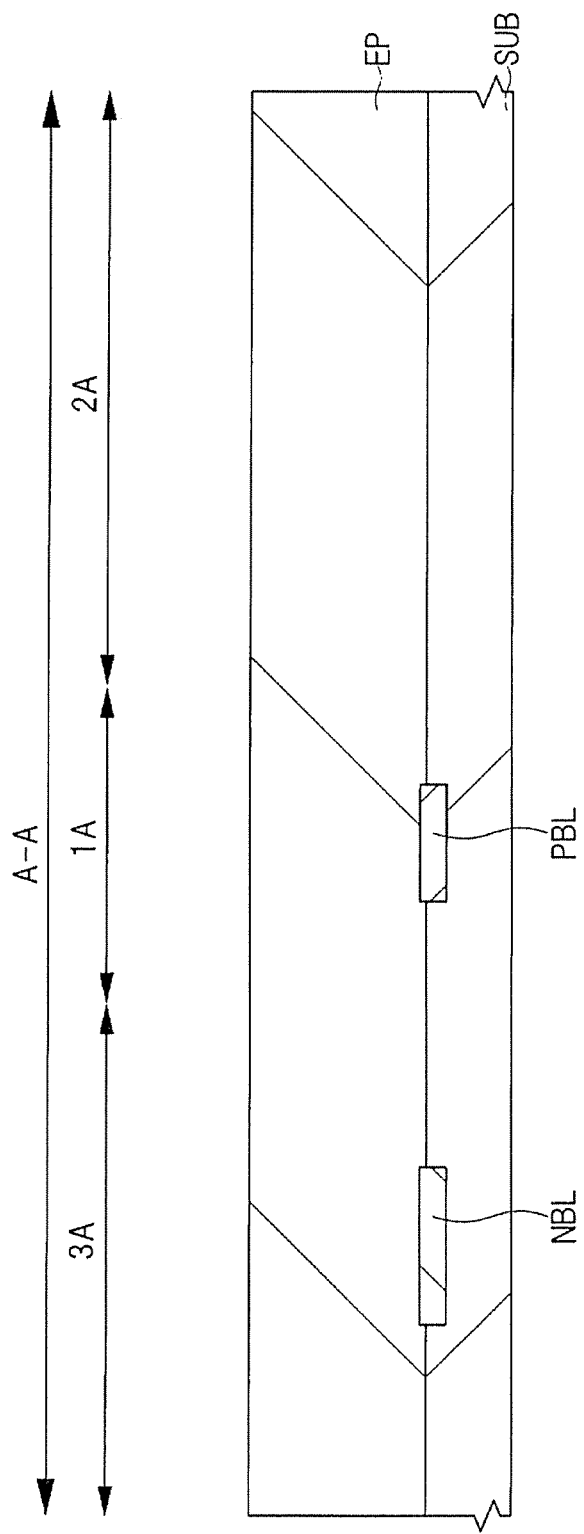
FIG. 8 is a cross-sectional view showing a manufacturing process of the semiconductor device according to Embodiment 1.

FIG. 8 shows a step of forming the buried layer PBL, the buried layer NBL, and the semiconductor layer EP.

First, a semiconductor substrate SUB made of silicon into which a p-type impurity is introduced is prepared. Next, p-type buried layers PBLs are formed in the semiconductor substrate SUBs of the regions 1A by photolithography and ion implantation. Next, n-type buried layers NBL are formed in the semiconductor substrate SUBs of the regions 3A by photolithography and ion implantation. The step of forming the buried layer NBL may be performed before the step of forming the buried layer PBL.

Next, on the semiconductor substrate SUBs of the regions 1A to 3A, semiconductor layers EP made of silicon into which n-type impurities are introduced are formed by an epitaxial growth method using, for example, phosphorus (P) gases. At this time, in the vicinity of the border between the semiconductor substrate SUB and the semiconductor layer EP, the impurity constituting the buried layer PBL and the buried layer NBL is diffused into a part of the semiconductor layer EP.

Figure 9:
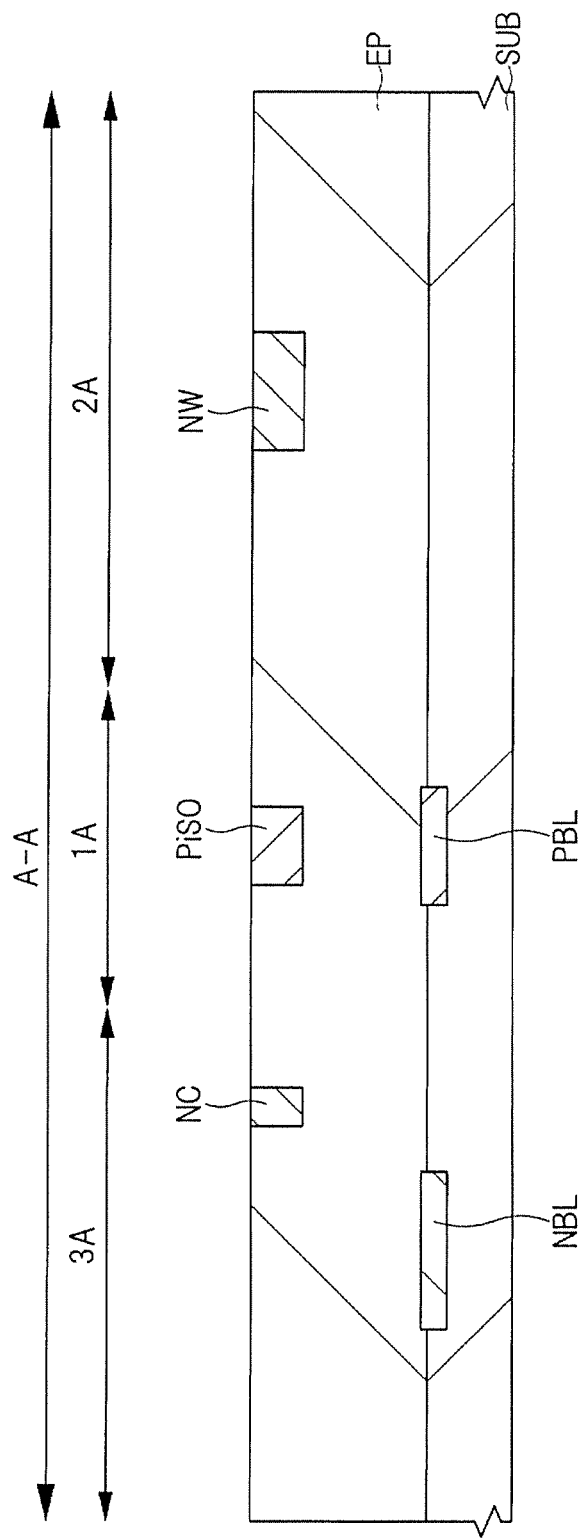
FIG. 9 is a cross-sectional view showing a manufacturing step following FIG. 8.
Figure 10:
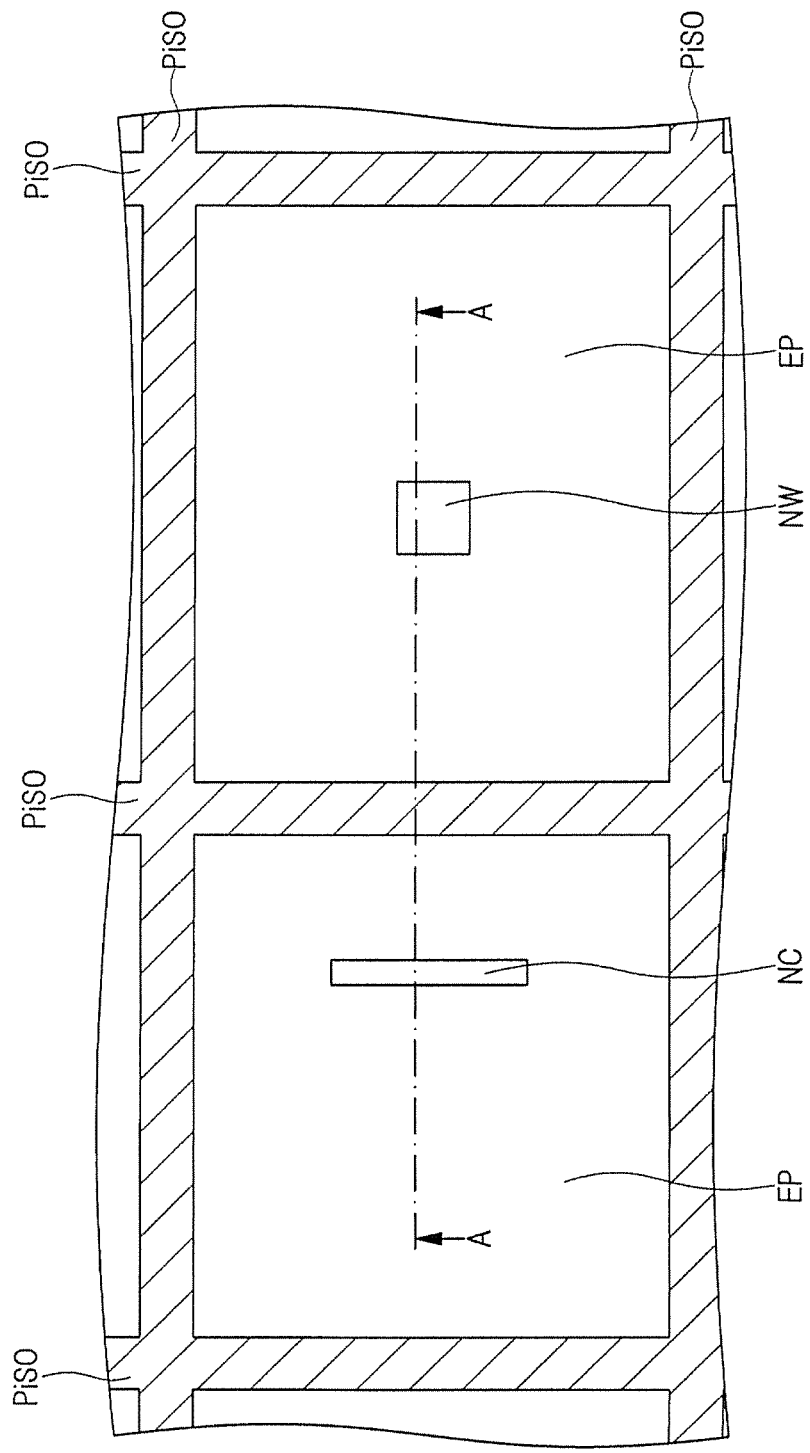
FIG. 10 is a plan view when the manufacturing process of FIG. 9 is completed.

FIG. 9 shows a step of forming the isolation layers PiSO, the well regions NW, and the collectors NC. FIG. 10 is a plan view when the steps of FIG. 9 are completed.

First, a p-type isolation layer PiSO is formed in the semiconducting layer EP in the region 1A by photolithography and ion implantation. Next, an n-type well region NW is formed in the semiconductor layer EP of the region 2A by photolithography and ion implantation, and at the same time, an n-type collector region NC is formed in the semiconductor layer EP of the region 3A. The step of forming the well regions NW and the collector regions NC may be performed prior to the step of forming the isolation layers PiSO. As shown in FIG. 10, the isolation layers PiSO are formed so as to surround the well regions NW and the collectors NC of the regions 3A of the regions 2A in plan view.

Figure 11:
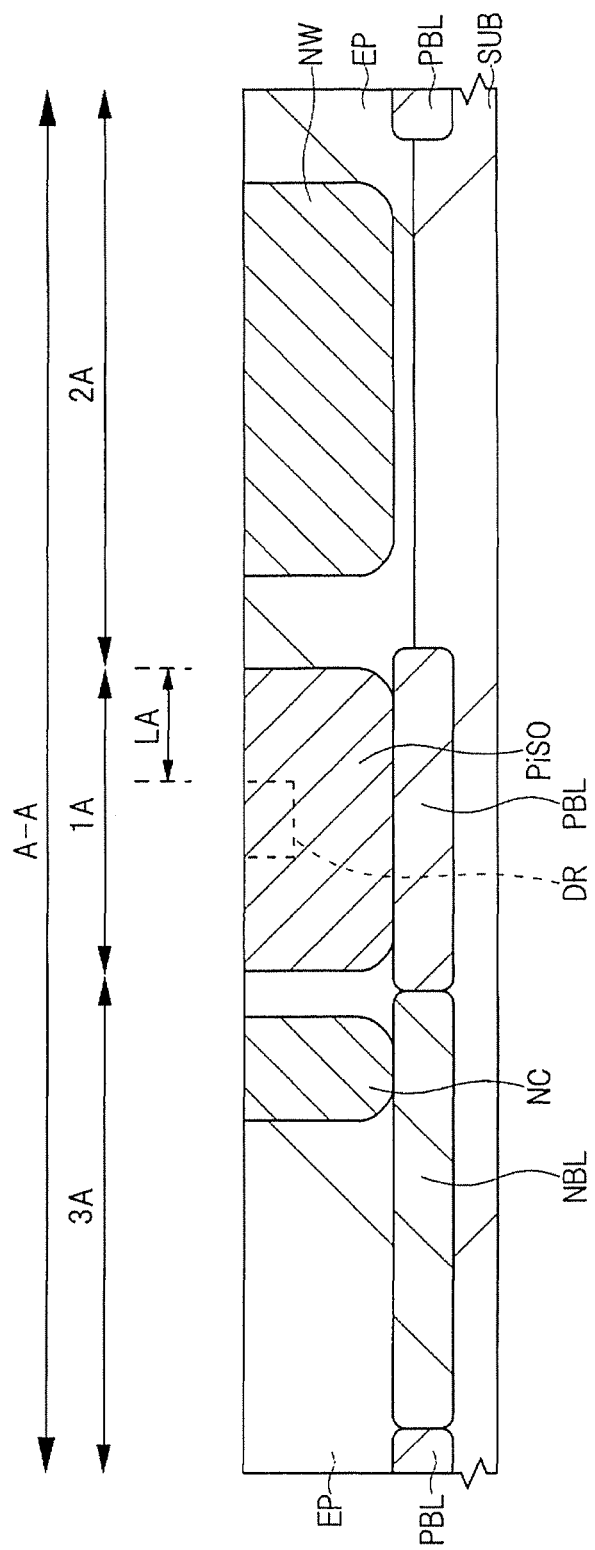
FIG. 11 is a cross-sectional view showing a manufacturing process following FIG. 9.
Figure 12:
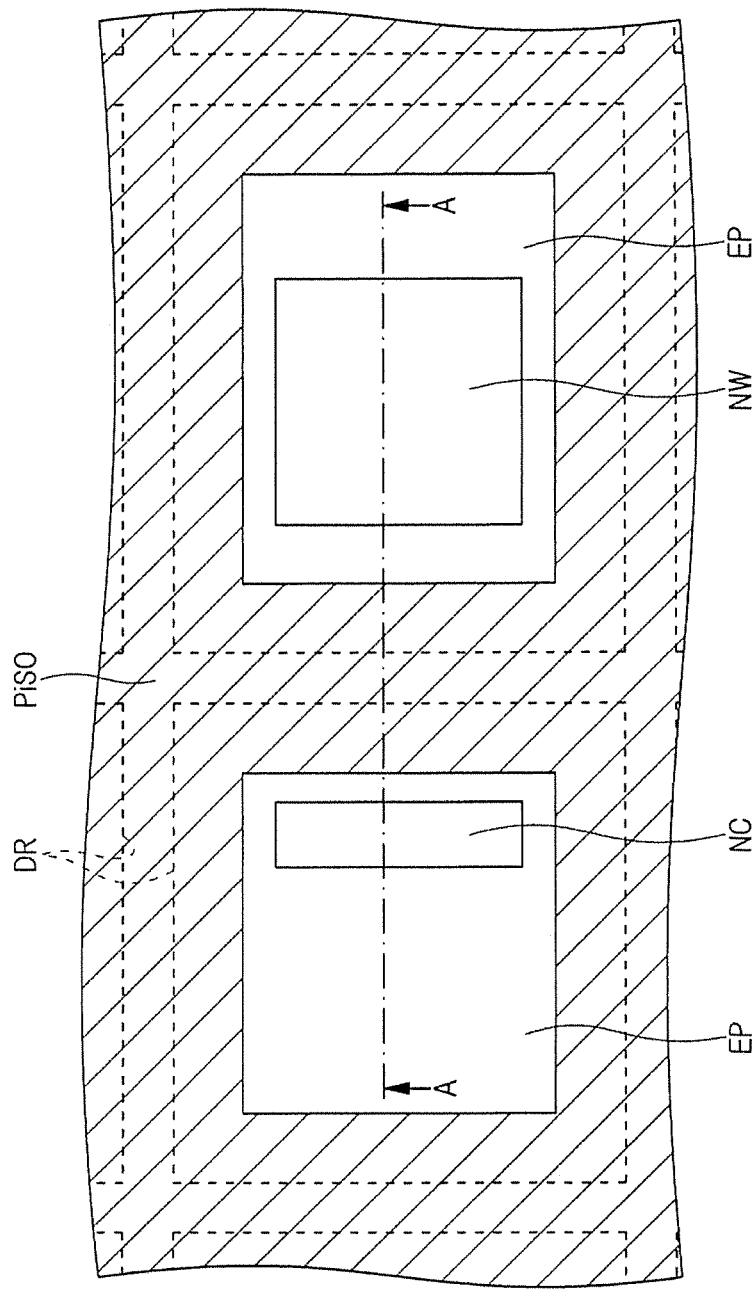
FIG. 12 is a plan view when the manufacturing process of FIG. 11 is completed.

FIG. 11 shows a heat treatment process for each impurity region. FIG. 12 is a plan view when the process of FIG. 11 is completed.

The semiconductor substrate SUB is subjected to heat treatment in an atmosphere of an inert gas such as nitrogen gas, for example, at 1050 to 1150° C. for 10 to 12 hours. By this heat treatment, as shown in FIG. 11, the impurities included in the buried layer PBL, the buried layer NBL, the isolation layer PiSO, the well region NW, and the collector region NC are diffused, and the impurities included in these impurity regions are activated. Here, the isolation layer PiSO is diffused to reach the buried layer PBL, and the collector region NC is diffused to reach the buried layer NBL. As shown in FIG. 12, the isolation layer PiSO is diffused so as to surround each of the semiconductor layer EP including the well region NW of the region 2A and the semiconductor layer EP including the collector region NC of the region 3A in plan view.

In FIG. 11, the position of the separation layer PiSO before the heat treatment is indicated by a broken line, and the distance from the end of the separation layer PiSO before the heat treatment to the end of the separation layer PiSO after the heat treatment is indicated as the distance LA. See the description of FIG. 6 above for this distance LA.

Figure 13:
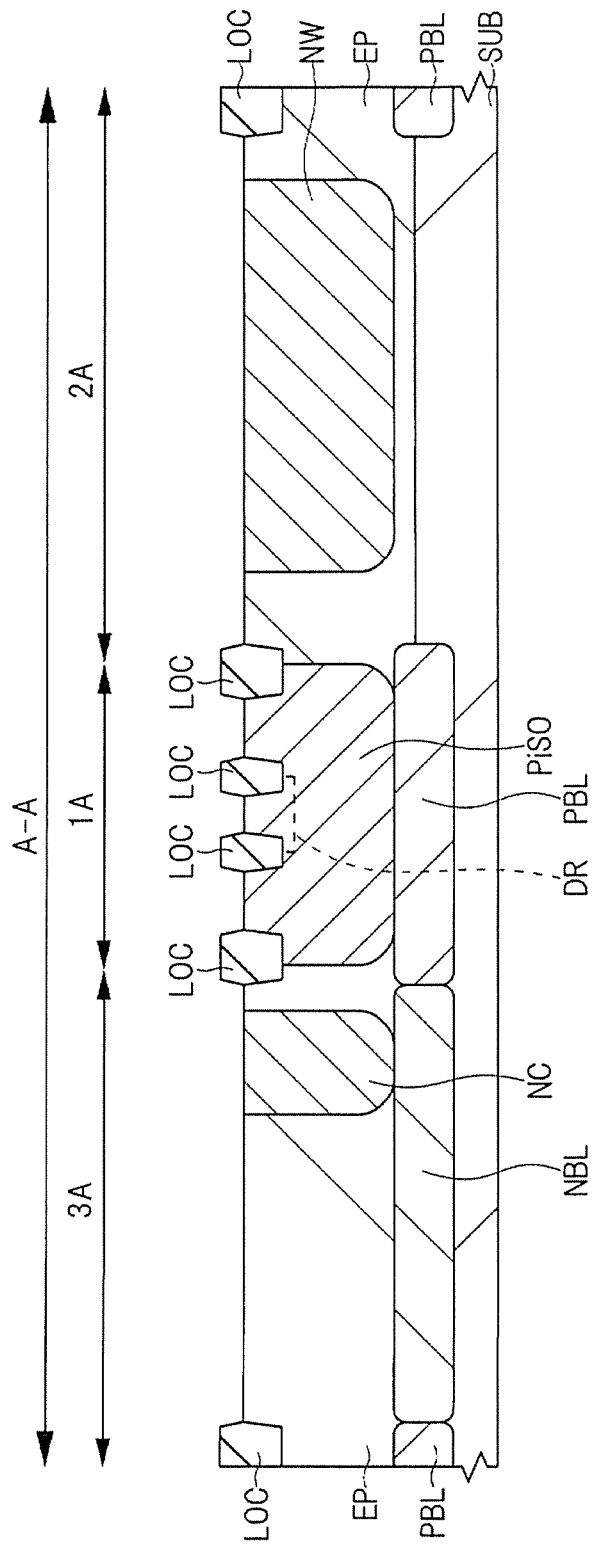
FIG. 13 is a cross-sectional view showing a manufacturing process following FIG. 11.

FIG. 13 shows a step of forming the insulating isolation portion LOC.

First, in the region 1A to 3A, a silicon nitride film is formed on the semiconductor layer EP by, e.g., CVD (Chemical Vapor Deposition) method. Next, the silicon nitride film is selectively removed by photolithography and dry etching. Next, the semiconductor layer EP that is not covered with the silicon nitride film is oxidized by a thermal oxidation treatment, whereby an insulating isolation portion LOC made of a silicon oxide film is selectively formed on the surface of the semiconductor layer EP. Thereafter, the silicon nitride film is removed by wet etching or the like. Although detailed illustration is omitted, a bird's peak occurs between the silicon nitride film and the semiconductor layer EP, and in the present embodiment, such a bird's peak is also defined as a part of the insulating isolation portion LOC.

The isolation portions LOC may have STI (Shallow Trench Isolation) structure. In this case, first, a groove is formed in the semiconductor layer EP by photolithography and dry etching. Next, a silicon oxide film is formed on the semiconductor layer EP including the inside of the trench by, e.g., CVD. Next, the silicon oxide film is polished by CMP (Chemical Mechanical Polishing) method to remove the silicon oxide film outside the trench. As described above, the silicon oxide film is buried in the trench, whereby the insulating isolation portion LOC having the STI structure can be formed.

Figure 14:
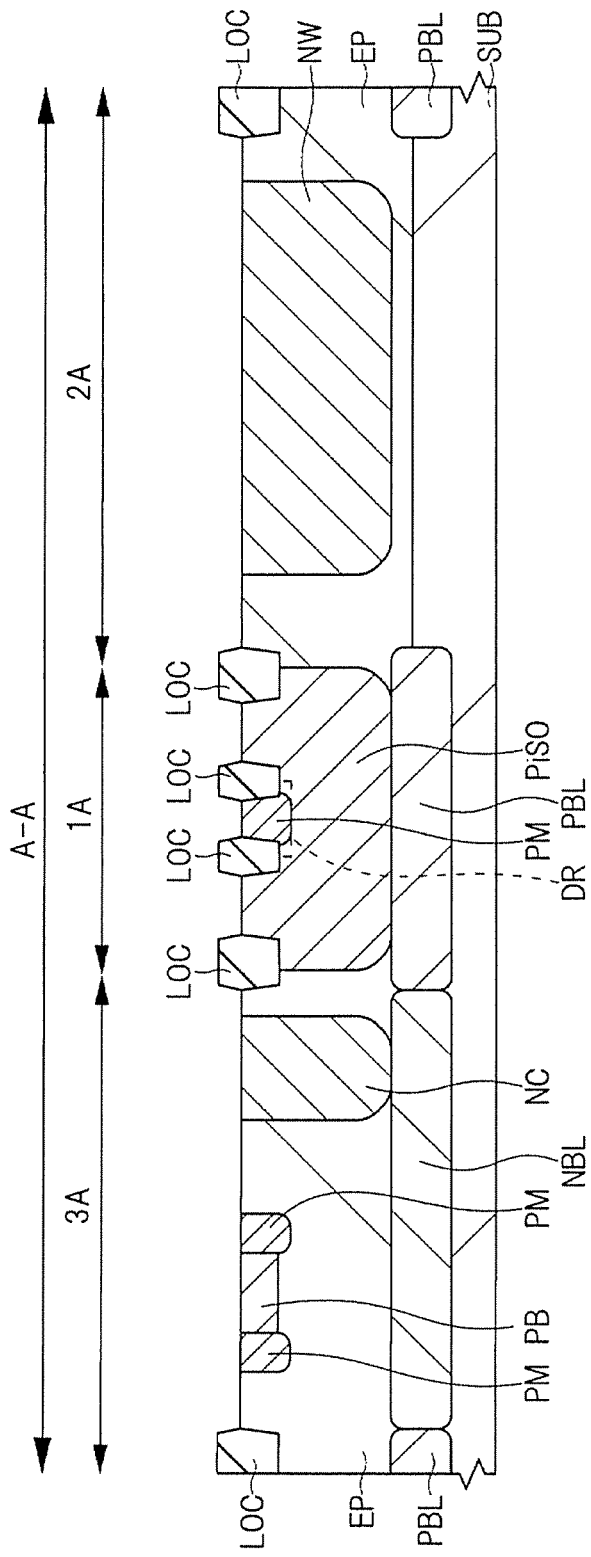
FIG. 14 is a cross-sectional view showing a manufacturing process following FIG. 13.

FIG. 14 shows a step of forming the base region PB and the diffusion region PM.

First, a p-type diffused region PM is formed in the isolation layer PiSO of the region 1A and the semiconductor layer EP of the region 3A by photolithography and ion implantation. Next, a p-type base region PB is formed in the semiconductor layer EP of the region 3A by photolithography and ion implantation. The step of forming the base region PB may be performed before the step of forming the diffusion region PM.

Figure 15:
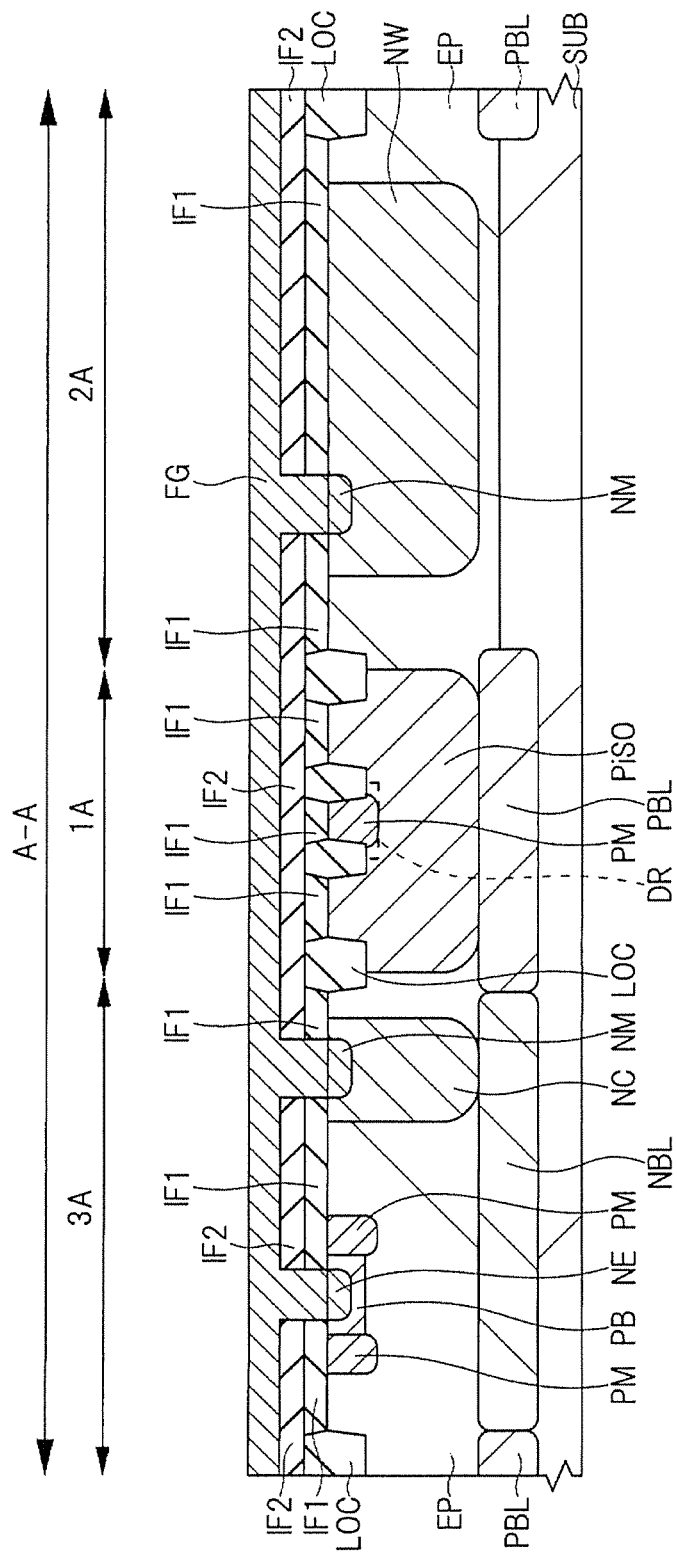
FIG. 15 is a cross-sectional view showing a manufacturing process following FIG. 14.

FIG. 15 shows steps of forming the insulating film IF1, the insulating film IF2, the conductive film FG, the diffused region NM, and the emitter region NE.

First, in the region 1A to 3A, an insulating film IF1 made of a silicon oxide film is formed on the semiconductor layer EP by a thermal oxidation process. At this time, although the thickness of the insulating isolation portion LOC may be slightly increased by oxidation, such illustration is omitted here for the sake of simplification of the description. Next, an insulating film IF2 made of, e.g., a silicon nitride film is formed on the insulating film IF1 and the insulating isolation portion LOCs by, e.g., CVD. Next, an opening is formed in a part of the insulating film IF2 and the insulating film IF2 by photolithography and dry-etching so as to open a part of the well region NW in the region 2A and a part of the collector region NC and a part of the base region PB in the region 3A.

Next, a conductive film FG made of, for example, a polysilicon film is formed on the insulating film IF2 including the inside of the opening by, for example, a CVD method. Next, an n-type impurity such as arsenic (As) is introduced into the conductive film FG by an ion implantation method.

Next, heat treatment is performed on the n-type conductive film FG to activate the impurities contained in the conductive film FG and to diffuse a part of the impurities contained in the conductive film FG into the semiconductor layer EP. The diffused impurity forms an n-type diffusion region NM in the well region NW in the region 2A, and forms an n-type diffusion region NM and an n-type emitter region NE in the collector region NC and the base region PB, respectively, in the collector region NC and the base region PB in the region 3A.

Figure 16:
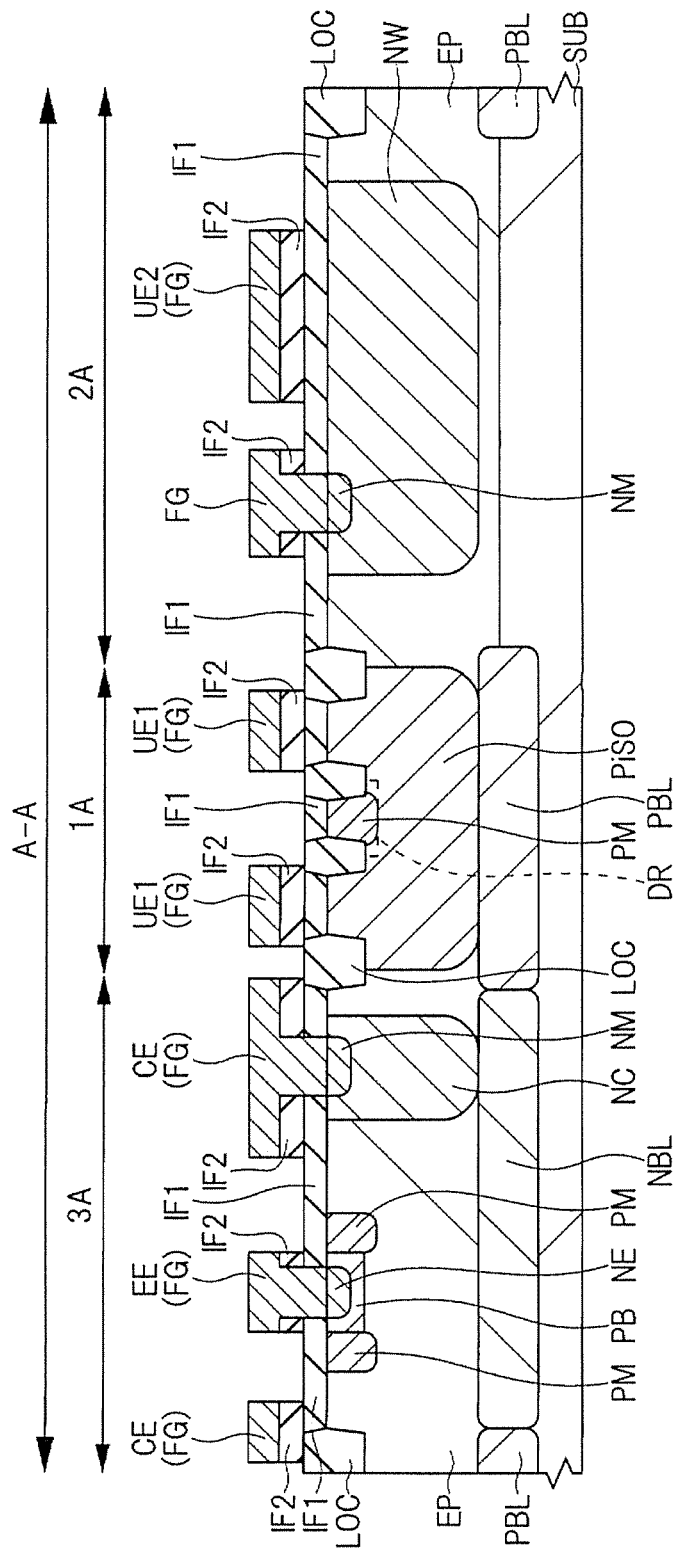
FIG. 16 is a cross-sectional view showing a manufacturing process following FIG. 15.

FIG. 16 shows steps of forming the upper electrode UE1, the upper electrode UE2, the collector electrode CE, and the emitter electrode EE.

The conductive film FG and the insulating film IF2 are patterned by a photolithography technique and a dry-etching process to form electrodes made of the conductive film FG in the region 1A to 3A. That is, the upper electrode UE1 is formed in the region 1A, the upper electrode UE2 is formed in the region 2A, the conductive film FG serving as a connecting portion to the well region NW is left, and the collector electrode CE and the emitter electrode EE are formed in the region 3A.

Thereafter, the interlayer insulating film IL, the plugs PG, and the wiring of the first wiring layer M1 are formed, whereby the semiconductor device shown in FIG. 1 is manufactured.

First, an interlayer insulating film IL made of, e.g., a silicon oxide film is formed by, e.g., CVD so as to cover the conductive film FG in the region 1A to 3A. Next, a plurality of contact holes are formed in the interlayer insulating film IL by photolithography and dry etching. Next, a plug PG mainly composed of a tungsten film is buried in each of the plurality of contact holes.

The process of forming the plug PG will be described below. First, a barrier metal film made of, for example, a laminated film of a titanium film and a titanium nitride film is formed on the interlayer insulating film IL including the inside of each of the plurality of contact holes by a sputtering method or a CVD method. Next, the tungsten film is formed on the barrier metal film by, e.g., CVD. Next, by removing the barrier metal film and the tungsten film formed on the interlayer insulating film IL by the CMP method, the plug PG including the barrier metal film and the tungsten film is formed in each of the plurality of contact holes.

Next, on the interlayer insulating film IL, the plugs PG are connected to each other, and each wiring mainly composed of an aluminum film is formed. First, a first barrier metal film, the aluminum film, and a second barrier metal film are sequentially formed on the interlayer insulating film IL by, for example, a sputtering method or a CVD method. Next, the second barrier metal film, the aluminum film, and the first barrier metal film are patterned by photolithography and dry-etching, thereby forming wiring in the first wiring layer M1. That is, the power supply potential wiring WD and the reference potential wiring WS are formed in the region 1A and the region 2A, and the collectors wiring WC, the emitters wiring WE and the bases wiring WB are formed in the region 3A. The first barrier metal film and the second barrier metal film are, for example, laminated films of a titanium film and a titanium nitride film.

Embodiment 2

Hereinafter, the semiconductor device of the embodiment 2 will be described with reference to FIG. 17. Hereinafter, differences from the semiconductor device of the embodiment 1 will be mainly described.

In embodiment 1, the side surface SS2 of the upper electrode UE1 is provided on the inner side of the isolation layer PiSO from the interface between the isolation layer PiSO and the semiconductor layer EP, and is provided at a position equal to or less than (¾)×the distance LA from the defective area DR.

Figure 17:
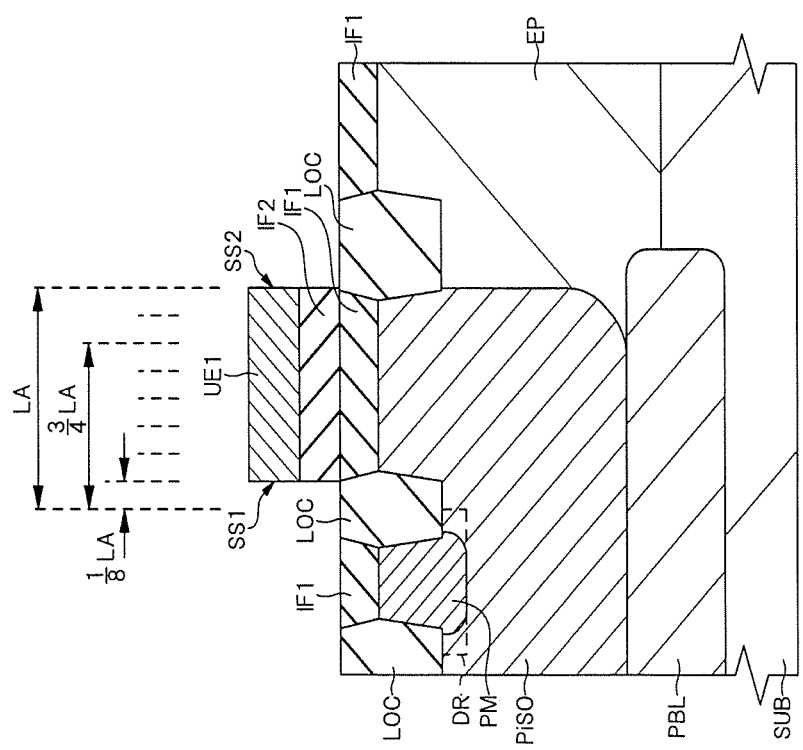
FIG. 17 is an enlarged cross-sectional view showing a semiconductor device according to Embodiment 2.

In the embodiment 2, the length of the upper electrode UE1 is increased, and the side surface SS2 of the upper electrode UE1 is provided at a position larger than (¾)×the distance LA from the defect region DR, and in FIG. 17, it is provided at a position at a distance LA from the defect region DR. That is, the side surface SS2 of the upper electrode UE1 is provided on the interface between the isolation layer PiSO and the semiconductor layer EP, which corresponds to the sample 1 of FIG. 7 to be described later. In addition, the side surface SS2 of the upper electrode UE1 may be provided on the outer side of the separation layer PiSO from the interface between the separation layer PiSO and the semiconductor layer EP, which corresponds to the sample 2 in FIG. 7 described later. Along with this, the insulating isolation portion LOC formed in the vicinity of the interface between the isolation layer PiSO and the semiconductor layer EP is also formed so as to be shifted toward the semiconductor layer EP. As described above, the capacitance in the region 1A can be increased by increasing the length of the upper electrodes UE1.

However, in the semiconductor device of the embodiment 2, the breakdown voltage in the vicinity of the border between the isolation layer PiSO and the semiconducting layer EP may be lowered as compared with the embodiment 1. In the sample 1 position in FIG. 7, as shown in FIG. 17, the side surfaces SS2 of the upper electrodes UE1 are provided at distances LA from the defective areas DR. Sample 2 shown in FIG. 7 is a case where the side surface SS2 of the upper electrode UE1 is provided at a position larger than the distance LA from the defective area DR, that is, a case where the upper electrode UE1 extends immediately above the semiconductor layer EP. Though not shown here, the side surface SS2 of the upper electrodes UE1 of the sample 2 is provided at a position (5/4)×distance LA from the defective area DR.

As shown in FIG. 7, when the voltage applied to the upper electrodes UE1 and the semiconductor layer EP is equal to or less than 43V, the increase of the leakage current in the samples 1 and 2 is substantially the same as that in the embodiment 1, but when the voltage is higher than 43V, a rapid increase of the leakage current occurs in the samples 1 and 2, and breakdown due to a decrease in the withstand voltage is liable to occur. The volume value of Sample 2 was almost the same as the volume value of Sample 1.

Therefore, the embodiment 1 is superior to the embodiment 2 in terms of suppressing leakage current and ensuring withstand voltage. However, in the case of a relatively low-voltage region such as 32V or less, the capacitance in the region 1A can be increased more in the embodiment 2 than in the embodiment 1.

Embodiment 3

The semiconductor device of the embodiment 3 will be described below with reference to FIG. 18. Hereinafter, differences from the semiconductor device of the embodiment 1 will be mainly described.

In the embodiment 1, the upper electrodes UE1 are not provided immediately above the defective regions DR in order to prevent the film quality of the capacitor insulating film from deteriorating in the region 1A.

Figure 18:
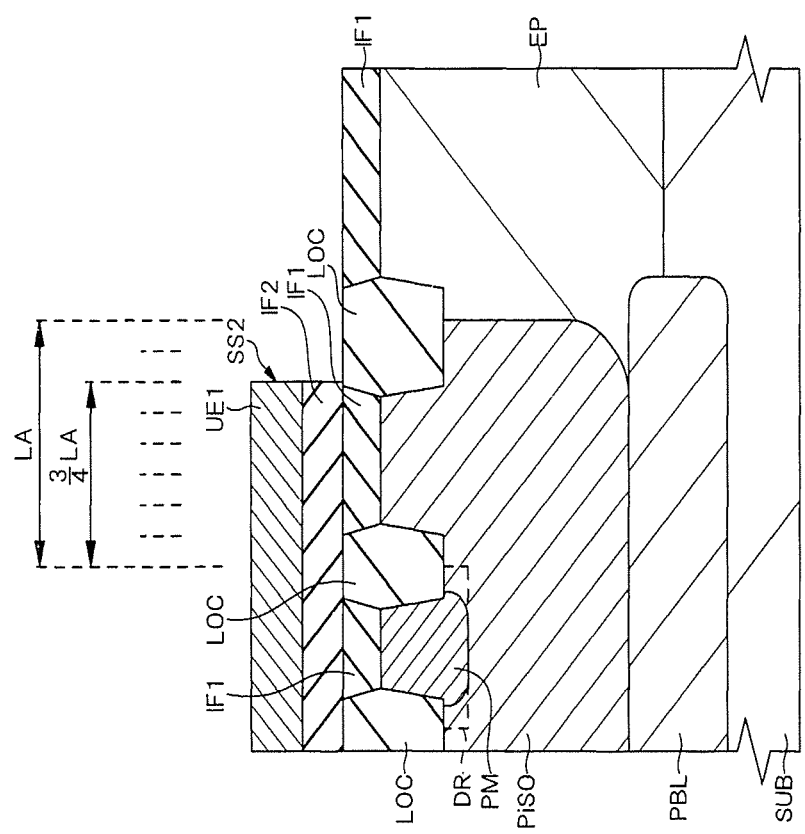
FIG. 18 an enlarged cross-sectional view showing a semiconductor device according to Embodiment 3.

In the embodiment 3, as shown in FIG. 18, the upper electrodes UE1, the insulating films IF2, and the insulating films IF1 are also formed directly on the defective regions DR (diffusion regions PM) at the portions where the plugs PG connected to the reference potential wiring WS are not formed, and the capacitive elements are formed on the defective regions DR (diffusion regions PM). Here, since the separation layer PiSO in FIG. 18 is integrally connected to the separation layer PiSO of the embodiment 1 or the embodiment 2, the separation layer PiSO in the embodiment 3 is electrically connected to the reference potential wiring WS, and constitutes the lower electrodes of the capacitor.

Depending on the quality required for the products or the potential difference between the upper electrode UE1 and the isolation layer PiSO serving as the lower electrode, the reliability may be acceptable even if the film quality of the capacitor insulating film is somewhat deteriorated. In such cases, the capacitance can be increased by providing the upper electrodes UE1 directly on a part of the region 1A as in the embodiment 3.

The technique of the embodiment 3 can be applied not only to the embodiment 1 but also to the embodiment 2.

Although the invention made by the inventor of the present application has been specifically described based on the embodiment, the present invention is not limited to the above embodiments, and various modifications can be made without departing from the gist thereof.

For example, in the above embodiment, although the p-type isolation layer PiSO is used for the configuration isolation region 1A, the conductivity of the respective components may be reversed, and the n-type isolation layer may be used for the element isolation region 1A. The n-type isolation layers are electrically connected to the power supply potential wiring WD, and the upper electrodes UE1 are electrically connected to the reference potential wiring WS.

What is claimed is:

1. A semiconductor device comprising:
    a semiconductor substrate of a first conductivity type having a first region between a second region and a third region in plan view, the second region for forming a first semiconductor element, the third region for a second semiconductor element;
    a semiconductor layer formed on the semiconductor substrate and being a second conductivity type opposite to the first conductivity type;
    a first buried layer of the first conductivity type formed between the semiconductor layer and the semiconductor substrate in the first region;
    an isolation layer of the first conductivity type formed from a front surface of the semiconductor layer to an inside of the semiconductor layer so as to be in contact with the first buried layer in the first region; and
    a conductive film formed over the isolation layer via a first insulating film,
    wherein a first capacitive element including the conductive film as an upper electrode, the first insulating film as a capacitive insulating film, and the isolation layer as a lower electrode, is formed over the semiconductor substrate in the first region.

2. A semiconductor device according to claim 1,
    wherein the first upper electrode has a first side surface and a second side surface located closer to a boundary between the isolation layer and the semiconducting layer than the first side surface, and is opposed to the first side surface,
    wherein in the first region, a defect region having a defect density higher than that of a part of the isolation layer located in a peripheral region thereof, and
    wherein the first side surface is provided at a position not overlapping with the defect region in plan view.

3. A semiconductor device according to claim 2,
    wherein in case of that a distance from the defect region to the interface between the isolation layer and the semiconductor layer is LA, the first side surface is provided at a position equal to or greater than (1/8)×LA from the defect region.

4. A semiconductor device according to claim 2,
    wherein the second side surface is provided at a position inside the separation layer rather than the interface between the separation layer and the semiconductor layer.

5. A semiconductor device according to claim 4,
    wherein in the first region, a defect region having a defect density higher than that of a part of the isolation layer located in a peripheral region thereof, and
    wherein in case of that a distance from the defect region to the interface between the isolation layer and the semiconductor layer is LA, the second side surface is provided at a position equal to or less than (3/4)×LA from the defect region.

6. A semiconductor device according to claim 2,
    wherein the second side surface is provided on a boundary between the separation layer and the semiconductor layer or at a position on an outer side of the separation layer than the boundary between the separation layer and the semiconductor layer.

7. A semiconductor device according to claim 1,
    wherein the upper electrode is electrically connected to a power supply potential wiring, and
    wherein the isolation layer is electrically connected to a reference potential wiring.

8. A semiconductor device according to claim 7,
    wherein in the first region, a first diffusion region having an impurity density higher than that of the separation layer is formed in the separation layer,
    wherein a first plug is provided on the first diffusion region, and
    wherein the separation layer is electrically connected to the reference potential wiring through the first plug and the first diffusion region.

9. A semiconductor device according to claim 8,
    wherein the capacitive insulating film and the first upper electrodes are formed on the first diffused region in a portion of the first region where the first plugs are not provided.

* * * * *